United States Patent [19]

Walker

[11] 4,323,852
[45] Apr. 6, 1982

[54] FAST RECOVERY ELECTRODE AMPLIFIER

[75] Inventor: D. David Walker, Iowa City, Iowa

[73] Assignee: University of Iowa Research Foundation, Iowa City, Iowa

[21] Appl. No.: 98,544

[22] Filed: Nov. 29, 1979

[51] Int. Cl.³ .............................................. H03F 1/02
[52] U.S. Cl. ....................................... 330/9; 328/162; 330/11; 330/51
[58] Field of Search ................. 330/9, 11, 51, 69, 110, 330/258; 328/162

[56] References Cited

U.S. PATENT DOCUMENTS 3,498,288  3/1970  Max et al. ....................... 330/51 UX
3,772,604  11/1973  Hogg et al. ...................... 330/110 X

OTHER PUBLICATIONS

Walker et al., "A Fast-Recovery Electrode Amplifier for Electrophysiology", *Electroencephalography and Clinical Neurophysiology*, vol. 45, Dec. 1978, pp. 789–792.

Primary Examiner—James B. Mullins
Attorney, Agent, or Firm—James C. Nemmers; Haven E. Simmons

[57] ABSTRACT

A fast recovery audio amplifier for use in electrophysiology and other neurological tests and techniques relating to nerve and muscle functions. The fast recovery amplifier recovers from overload in less than one millisecond, thus enabling its use in clinical electrophysiology to record time lapses from stimulus to response of less than several milliseconds. The amplifier achieves fast recovery primarily because it eliminates input and interstage coupling capacitors so that the feed-forward path from electrode to output is strictly a DC amplifier.

4 Claims, 5 Drawing Figures

FAST RECOVERY ELECTRODE AMPLIFIER

BACKGROUND OF THE INVENTION

Clinical nerve conduction studies have been used for many years as a diagnostic technique in the field of neurology. As a part of these diagnostic techniques, electromyograms (EMGs) are produced in response to nerve stimulation by electrical means. By use of EMGs, nerve condition velocities can be measured and analyzed as an aid in the diagnosis and treatment of various neurological disorders. For example, the blink reflex can be recorded using surface electrodes placed on the orbicularis oculi muscle after stimulation of the trigeminal nerve at the supraorbital foramen. In measuring the blink reflex using electrophysiological techniques, the active recording electrode is generally located approximately two centimeters away from the cathode of the stimulating electrodes. Another example of the use of electrophysiological techniques in measuring nerve conduction is the measurement of sensory, nerve and muscle action by stimulation of the median nerve at multiple points along its course between the palm and distal portion of the forearm. Generally, this technique involves measurements in increments of one centimeter, and the minimal distance between the stimulating and recording electrode is usually two to three centimeters. With this minimal distance, the time lapse from stimulus to response (latency) is usually less than two milliseconds.

The foregoing techniques are described in detail in various technical papers, especially those involving the work of Dr. Jun Kimura. Some of Dr. Kimura's work is described in the Journal of the Neurological Sciences, 1978, 38:1-10; in the Archives of Neurology, April 1977, 34:246-249; in the Electroencephalography and Clinical Neurophysiology, 1978, 45:789-792. The latter publication was co-authored by me and describes some aspects of my invention as set forth hereinafter.

Most electrode amplifiers used in electrophysiology recover from an overloading input to near quiescent baseline in five to ten milliseconds or more depending on the amplifier design and the amount of overload. Thus, in situations such as those referred to in the foregoing examples where the stimulus is coincident with an electrical event of sufficient magnitude to cause an overloading artifact, it is not possible to accurately record responses of latency less than several milliseconds. Thus, the accuracy and utility of EMGs using prior art electrode amplifiers is somewhat limited.

To a certain degree, the deficiencies of prior art electrode amplifiers can be partially avoided by using mechanical stimulation or by attempting to improve stimulus isolation. Also, modification of an AC amplifier and use of a compensator to offset the artifact can also be used to improve the accuracy of the recorded responses. Most electrode amplifiers consist of several stages in order to achieve the required gain, and the stages are AC-coupled to block DC operating levels. Usually, one or more of the coupling capacitors is variable to adjust the low frequency cutoff. In the quiescent state, there is a charge on each of the coupling capacitors according to the DC voltage difference between the stages. If an overloading input saturates the first stage, the charge on the coupling capacitor to stage two will change. When the overload is gone and the first stage returns to normal, this voltage difference, amplified by the succeeding stages, results in a large or sometimes saturated deflection at the amplifier output. This offset than decays at a rate set by the linear coupling time-constant and thus accounts for a long recovery time. Attempts have been made to reduce the recovery time of an amplifier by shortening the coupling time constants and/or reducing the voltage gain. However, this results in a loss of low frequency response or a loss in sensitivity or both. Thus, attempts to reduce the recovery time of prior art amplifiers to the point where they meet all the specifications required for electrophysiological recording have not met with success.

There is therefore a need for a relatively simple and inexpensive amplifier which recovers from overload in less then one millisecond without user adjustment, while still meeting the specifications required in clinical electrophysiology.

SUMMARY OF THE INVENTION

According to the invention, a fast recovery amplifier can be designed by eliminating the input and interstage coupling capaciters so that the feed-forward path from electrodes to output is strictly a DC amplifier. Then, in order to establish a low frequency cutoff and to eliminate DC electrode offset, an integrator feedback loop subtracts an offset signal from the stage one input. A circuit detects if the stage one output exceeds limits near saturation in either direction and, via a control circuit, opens the feedback loop. A capacitor, the charge on which represents the average offset value to keep the amplifier at baseline, holds this charge until the overload is gone. When the loop is reclosed, the capacitor restores the amplifier output to baseline.

An alternative and improved system for decreasing the recovery time of an electrode amplifier is to insert a "sample-and-hold" circuit in the path between the remote preamp and the main amplifier. The connection of the feedback loop is such that the sample and hold circuit opens the feedback loop in response to a central circuit. In this system, one of the control possibilities is to detect overload of the preamp with about 50 microseconds prediction. The feedback loop is then opened either on overload or predicated overload and reclosed only on actual recovery of the preamp signal.

DESCRIPTION OF THE PREFERRED EMBODIMENTS OF THE INVENTION

The fast recovery amplifier of the invention is designed primarily for the performance of diagnostic tests of nerve and muscle functions in the clinical practice of neurology. The fast recovery amplifier is designed for use with standard well-known storage oscilloscopes such as those marketed by Tektronix, Inc. Oscilloscope main frames of this type are presently available as part of some commercial EMG machines.

Figure 1:
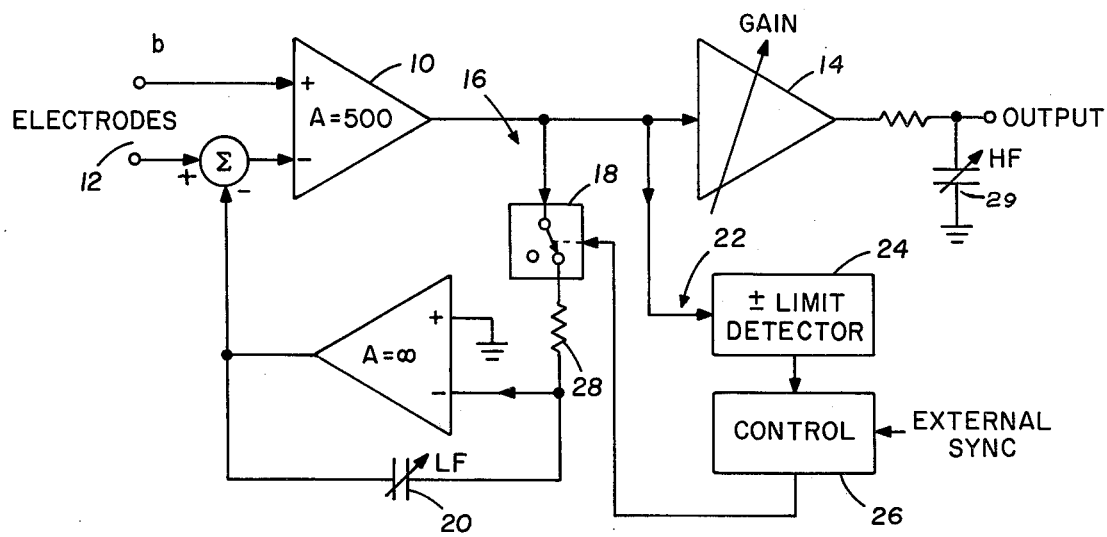
FIG. 1 is a schematic block diagram of a fast recovery amplifier constructed according to the principles of the invention.

The fast recovery amplifier of FIG. 1 incorporates the principles of the invention in a two-stage amplifier with the input of the first stage amplifier 10 (the preamp) being connected to positive and negative recording electrodes 12. The first stage output is connected to the input of the second stage amplifier 14 with no interstage coupling capacitor included. Amplifier 14 has provision for gain selection.

To achieve fast recovery, a feed-back loop 16 interconnects the first stage output and input. The feedback loop includes a switch 18 and a variable capacitor 20.

A control circuit 22 connected to the output of the first stage amplifier 10 detects whether or not the first stage output exceeds limits near saturation in either direction. Through a limit detector 24 and control 26, control circuit 22 opens or closes the feedback loop circuit 16. Thus, when feedback loop circuit 16 is closed by action of the control circuit 22, circuit 16 will subtract an offset signal from the input of the first stage amplifier 10. This is shown schematically as a subtraction in the negative lead of electrodes 12. Feedback loop circuit 16 thus sets a single low-frequency breakpoint at $$f = (K/2\pi RC)$$

where K is the fixed gain from the first stage offset input to the first stage output, C is the value of capacitor 20 and R is the value of resistor 28 in the feedback loop circuit 16. Thus, by varying capacitor 20, the low frequency cutoff is changed. The higher the value of capacitor 20, the lower the low-frequency cutoff and the quicker the recovery of the amplifier 10 from overload. This is in contrast to prior art amplifiers of this type where the opposite is true. To prevent the delay of recovery by the gain of succeeding stages, the high-frequency break point must be set in or after the last stage amplifier 14 as shown by variable capacitor 29.

In operation, when the control circuit 22 detects an output from the first stage amplifier 10 that exceeds limits near saturation in either direction, switch 18 is operated to open the feedback loop circuit 16. The charge on capacitor 20, representing the average offset value needed to keep the amplifier 10 at baseline, holds this charge until the limit detector 24 detects that the overload is gone or a fixed time duration is exceeded and then switch 18 is operated by control 26 to reclose the feedback loop circuit 16 and restore the amplifier 10 to baseline.

Figure 3:
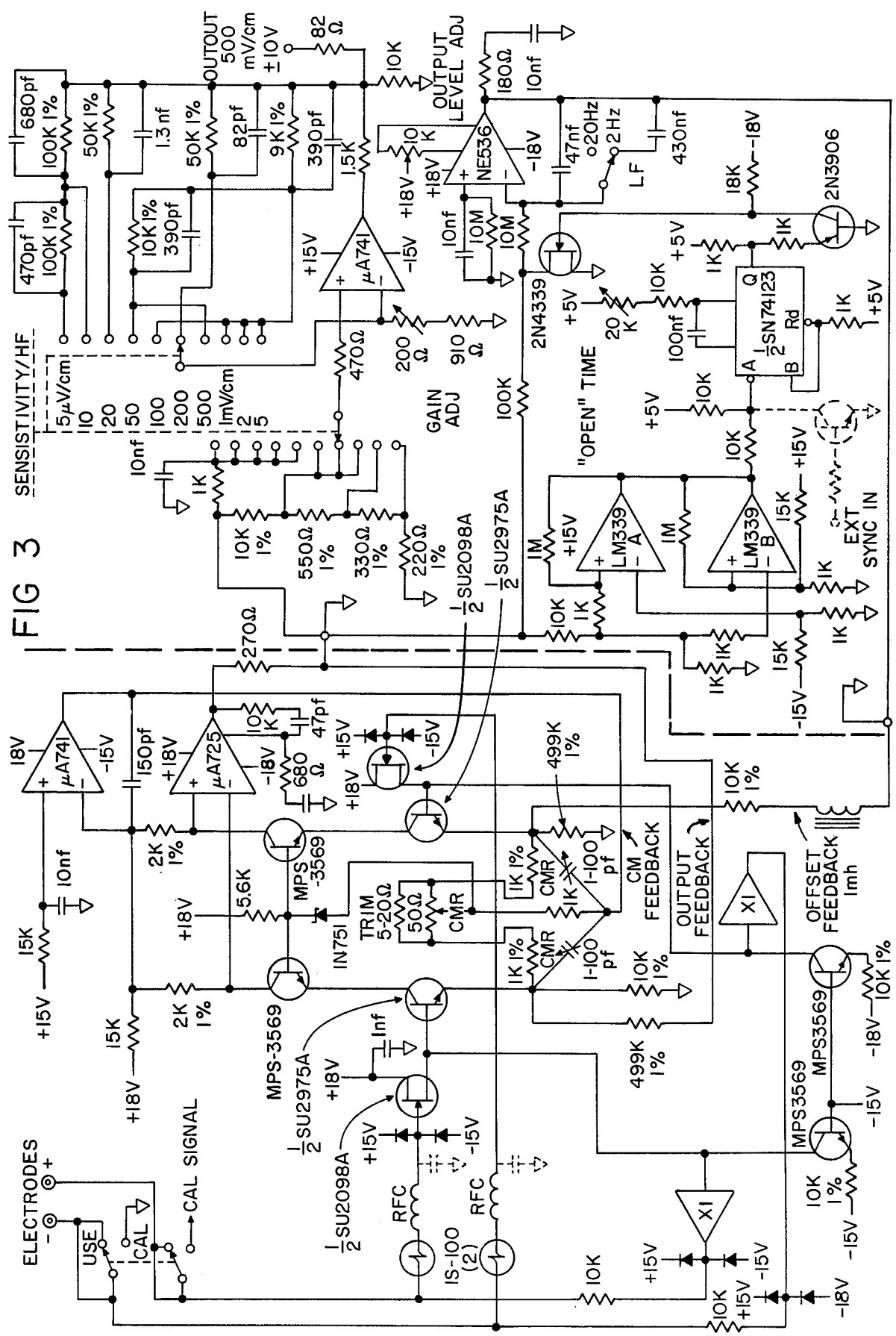
FIG. 3 is a detailed schematic of the circuit of FIG. 1.

FIG. 3 sets forth a detailed schematic that accomplishes the functions of the system of FIG. 1. Those skilled in the art will recognize that other circuits can be employed to achieve the same result.

Where the fast recovery amplifier circuit of the invention is used in connection with clinical electrophysiology, the output signal from amplifier 10 and the control 26 function to open and close the switch 18 in feedback loop 16. The control scheme preferably used is an open time of feedback loop circuit 16 of a predetermined amount, such as 1.2 milliseconds. However, other control functions besides fixed time can be utilized. For example, the duration of the overload can serve as the control function, as more fully explained in connection with the embodiment of FIG. 2. Also, when used in clinical electrophysiology, the first stage amplifier 10 and associated circuitry is preferably contained in a remote "preamp" box which can be placed near the electrode site. The circuit of FIG. 3 to the left of the broken line is the portion of the circuit that would normally be included in the preamp box.

Figure 2:
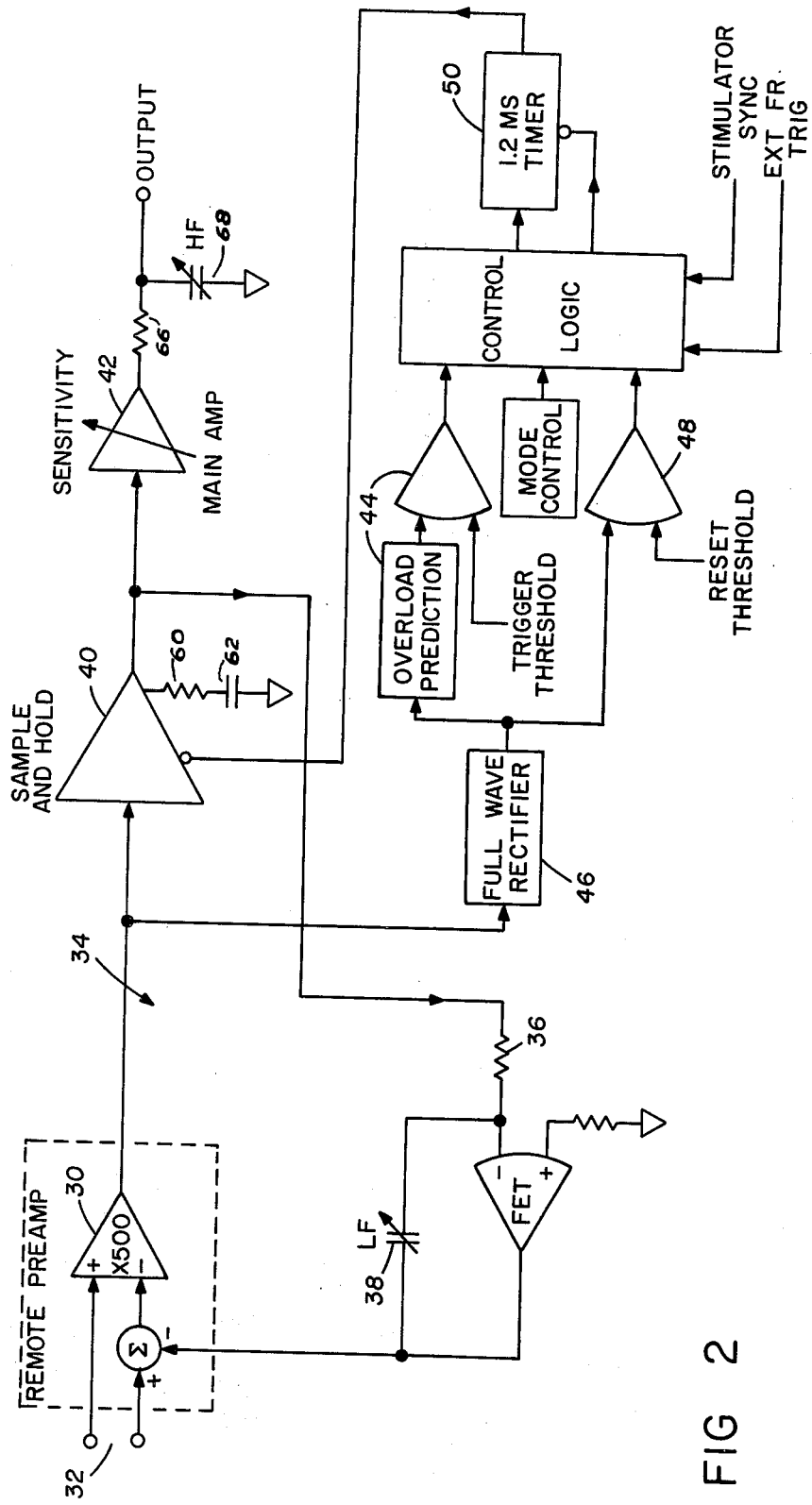
FIG. 2 is a schematic block diagram, of another embodiment of the invention.

In FIG. 2 there is illustrated a second embodiment of a fast recovery amplifier suitable for use in clinical electrophysiology.

In the second embodiment, the first stage amplifier 30 has its input lines connected to the positive and negative leads of the recording electrodes 32. Similar to the first embodiment of FIG. 1, there is a feedback loop circuit 34 that subtracts an offset signal from the input of the first stage amplifier 30, this being shown schematically as a subtraction in the negative electrode lead. A feedback loop circuit 34 includes a resistor 36 and a variable capacitor 38 that functions in a manner similar to capacitor 20 of the embodiment of FIG. 1.

The second embodiment of FIG. 2, however, includes a sample-and-hold circuit 40 that performs the function of switch 18 of the first embodiment. In other words, the sample-and-hold circuit 40 opens the feedback loop circuit 34 on overload and recloses it and restores the amplifier 30 to baseline in accordance with the control portion of the circuit.

However, instead of the fixed open time control of the embodiment of FIG. 1, the limit detection of the embodiment of FIG. 2 includes a circuit to predict possible overload of the amplifier 30 before it actually occurs and to reset the "open time" if the amplifier returns to baseline within predetermined limits. The predictive circuit determines at any moment if the output from amplifier 30 will overload within the next 50 microseconds, for example, assuming that it maintains its current rate of change (slope).

The sample-and-hold circuit 40 is normally in the "sample" mode in which the output signal from amplifier 30 passes through to the main or second stage amplifier 42. However, if the output signal from the first stage amplifier 30 exceeds limits near saturation in either direction, the sample-and-hold circuit 40 is switched to the "hold" mode. Overload detection in the output signal from amplifier 30 in both a positive and negative direction is accomplished using a single comparator 44 by full wave rectification of the output signal from amplifier 30 through rectifier 46. A second comparator 48 detects the return of the amplifier 30 to normal limits and allows for the earlier cancellation of the "open time" interval established by timer 50. Of course, the open time interval could be set at any suitable time depending upon the application in which the circuit is used. In the first embodiment of FIG. 1, the open time interval was fixed and the output of amplifier 10 was saturated for the duration of the overload. In the embodiment of FIG. 2, overloads in the output signal from amplifier 30 less than the open time interval are suppressed, and on recovery the amplifier 30 is allowed to resume functioning almost immediately. This has been demonstrated to allow recovery times as short as 0.1 ms.

If desired, and as indicated in FIG. 2, provision can be made to trigger a fast recovery sequence using external signals such as the sources of overloading artifacts. In addition, provision can be made to enable/disable the fast recovery feature or the recovery/reset feature.

As in the embodiment of FIG. 1, the feedback loop circuit 34 establishes a low frequency cutoff and also eliminates DC electrode offset by subtracting an offset signal from the input of the first stage amplifier 30. By varying the capacitor 38, the low frequency cutoff can be varied.

In the hold mode of the sample-and-hold circuit 40 of FIG. 2, the output of the circuit 40 is a constant value equal to the output signal of the amplifier 30 at the time of switching to the hold mode, however, somewhat integrated over a small time period set by resistor 60 and capacitor 62. With the predictive detection of an overload in the output signal of amplifier 30, the main amplifier 42 and the feedback loop circuit 34 are never subjected to the overloaded output signal from amplifier 30, and thus in the final output the overload is largely suppressed. Again the high frequency break point is set after the last stage amplifier 42 by RC circuit 66, 68.

Figure 4:
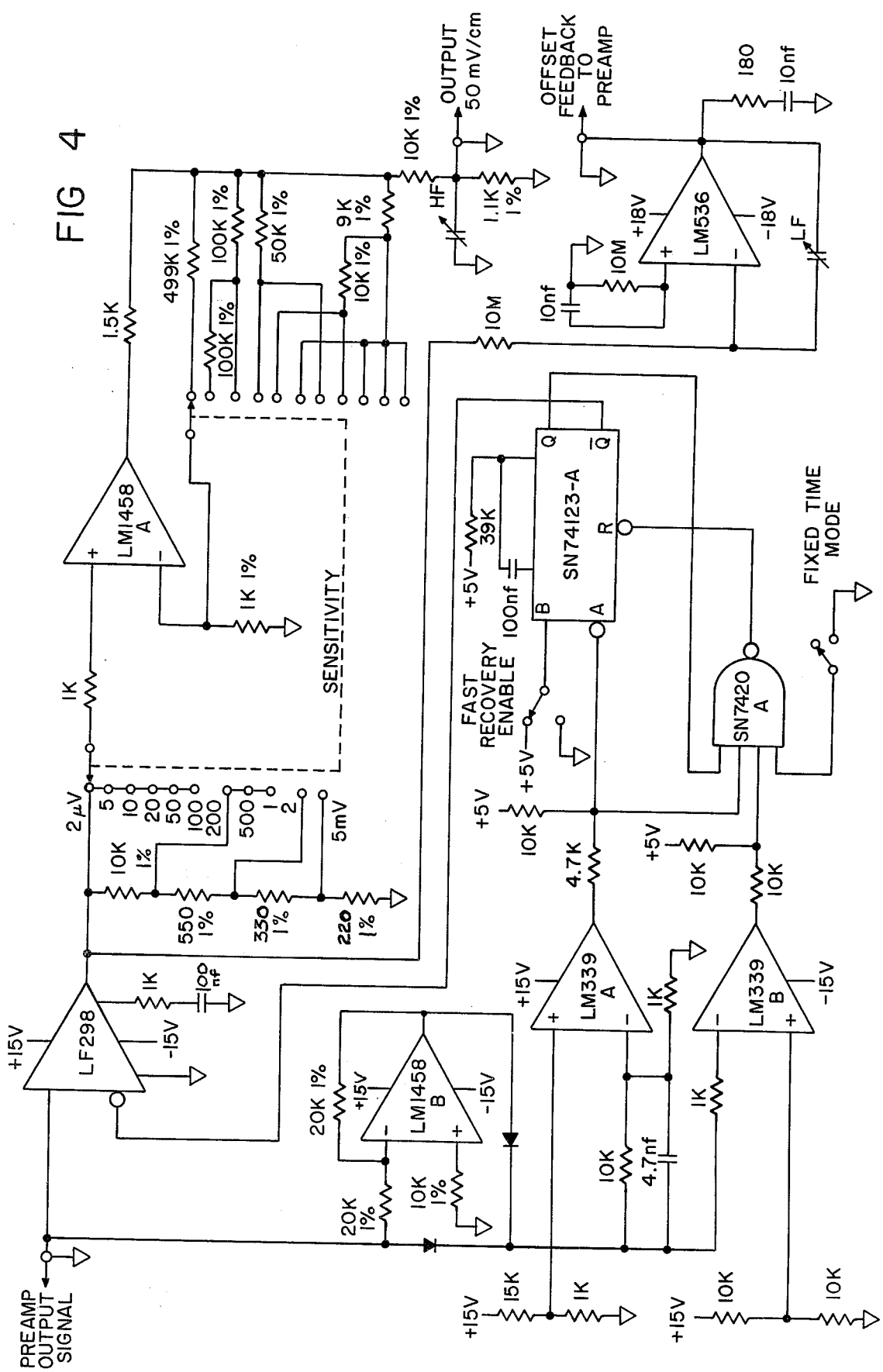
FIG. 4 is a detailed schematic of the circuit of FIG. 2 except for the preamp.

I have shown in FIG. 4 an example of a detailed schematic of a circuit that will accomplish the functions of the system of FIG. 2. FIG. 4 shows all of the circuit except for the amplifier 30, the circuit for amplifier 30 being the same as amplifier 10 of the first embodiment which is shown in detail in FIG. 3.

Figure 5:
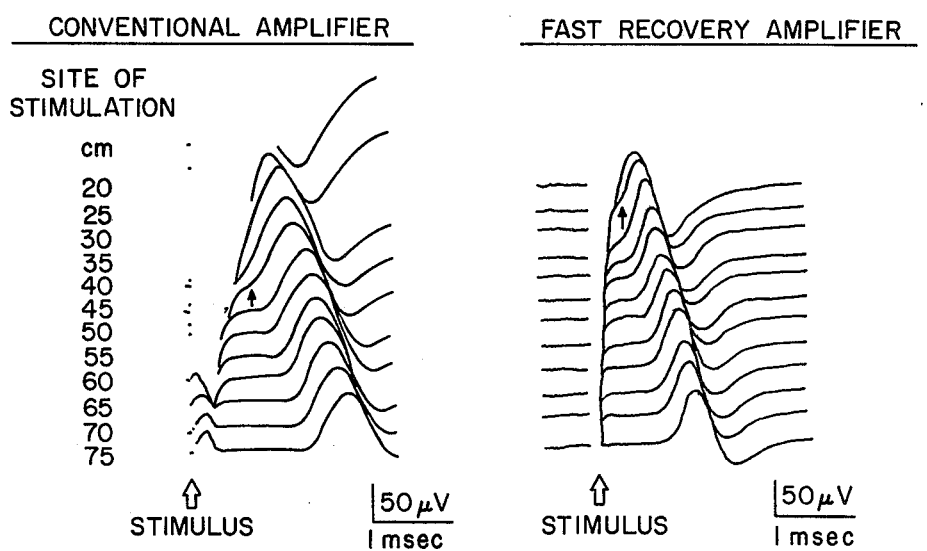
FIG. 5 is a chart comparing sensory nerve potential measurements using a conventional amplifier and a fast recovery amplifier constructed according to the principles of the invention.

From the description of the invention as set forth in the embodiments of FIGS. 1 and 2, it will be evident that a fast recovery amplifier has been produced by eliminating the input and interstage coupling capacitors found in the conventional electrode amplifiers. Thus, the feed forward path from the electrodes to the output is strictly a DC amplifier and recovers essentially immediately because it contains no significant capacitors to store charge. The fast recovery feature is essential to produce accurate and meaningful results in clinical electrophysiology. By using the fast recovery amplifier of the invention, the problem of stimulus artifact is greatly reduced when measuring nerve condition times over very short distances. In such situations where the minimal distance between the stimulating and recording electrode is two to three centimeters, a potential with a latency less than two milliseconds can be adequately recorded. The charts shown in FIG. 5 show a comparison between the fast recovery amplifier of the invention and conventional amplifiers. These charts were taken from tests in which the median nerve was stimulated at multiple points along its course between the palm and distal forearm using increments of 0.5 centimeters. Sensory nerve potentials were recorded using surface electrodes. The number in the left hand column of FIG. 5 represents the distance in centimeters between the stimulating cathode and the recording electrode. The small arrow in each chart indicates the first response with clear onset of negative (upward) deflection from the baseline.

I have thus designed a fast recovery amplifier that overcomes the problems of stimulus artifact thus permitting the detection and recording of short latency potentials. The fast recovery amplifier is easy to operate and more accurate than conventional means. It can be used in connection with digital readout for fast and accurate measurement of the response time, and provision can be made for connection to an external computer system for remote control and storage or analysis of data.

Having thus described the invention in connection with preferred embodiments thereof, it will be evident to those skilled in the art that various revisions and modifications can be made to the invention without departing from the spirit and scope thereof. It is my intention, however, that all such revisions and modifications as are obvious to those skilled in the art will be included within the scope of the following claims.

I claim:

1. A fast recovery audio amplifier comprising a first stage amplifier having a differential input, a second stage amplifier having provision for gain selection and whose input is direct-coupled to the output of said first stage amplifier, a feedback circuit responsive to the output of said first stage amplifier for selectively introducing into the input of said first stage amplifier an offset signal for varying the output of said first stage amplifier at sufficient gain to provide for cancellation of the expected common-mode signal of the differential input of said first stage amplifier, control means for opening and closing said feedback circuit, a control circuit responsive to the output of said first stage amplifier so as to provide a signal to said control means to open or close said feedback circuit depending upon the variance of said output signal from a threshold value, said control circuit including predictive means responsive to the output signal of said first stage amplifier to predict whether or not said signal will vary from said threshold value within a predetermined time and provide a control signal to said control means to close said feedback circuit if said output signal of said first stage amplifier is or is predicted to be within said threshold value of the expiration of said predetermined time, and a sample-and-hold circuit in said control means, the input of the sample-and-hold circuit being the output of said first stage amplifier, said sample-and-hold circuit having a control signal input from said control circuit, the output signal of said sample-and-hold circuit providing for opening or closing of said feedback circuit, and said sample-and-hold circuit normally being in the sample mode in which the output from the first stage amplifier is passed through to the second stage amplifier but switching to the hold mode in response to a control signal input from said control circuit based upon a predetermined function of the output signal from said first stage amplifier.

2. The fast recovery audio amplifier of claim 1 in which said control circuit includes a timer providing an output signal that is the control signal input to said sample-and-hold circuit, a full-wave rectifier whose input is the output of said first stage amplifier, a threshold-detecting circuit whose input is the output of said rectifier and whose output is an indication of whether the output of said first stage amplifier is or will be within a predetermined time above or below said threshold value whose output is the input to said timer to control said timer.

3. The fast recovery audio amplifier of claim 2 in which there is a second threshold-detecting circuit whose input is the output of said rectifier and whose output is an indication of whether the output of said first stage amplifier is above or below a second threshold value, a control logic circuit whose inputs are the outputs from said first and second threshold detecting circuits, and external logic inputs from external sources to said control logic circuit, the output from said control logic circuit being the input to said timer to start said timer and allow said timer to finish a predetermined time interval or reset said timer at some time prior to the end of the predetermined time interval in response to the input from said first and second threshold-detecting circuits.

4. A fast recovery audio amplifier comprising a first stage amplifier having a differential input, a second stage amplifier having provision for gain selection and whose input is direct-coupled to the output of said first stage amplifier, a feedback circuit responsive to the output of said first stage amplifier for selectively introducing into the input of said first stage amplifier an offset signal for varying the output of said first stage amplifier at sufficient gain to provide for cancellation of the expected common-mode signal of the differential input of said first stage amplifier, control means normally closing said feedback circuit, and a control circuit responsive to the output of said first stage amplifier so as to provide a signal to said control means immediately to open or close said feedback circuit depending upon the variance of said output signal from a threshold value so as to maintain said first stage amplifier at baseline, and said control circuit including predictive means responsive to the output signal of said first stage amplifier to predict whether or not said signal will vary from said threshold value within a predetermined time and to provide a control signal to said control means to close said feedback circuit if said output signal of said first stage amplifier is or is predicted to be within said threshold value before the expiration of said predetermined time.

* * * * *